United States Patent
Huang et al.

(10) Patent No.: US 12,366,624 B2
(45) Date of Patent: Jul. 22, 2025

(54) MOTION CORRECTION METHOD AND APPARATUS FOR MAGNETIC RESONANCE IMAGE, AND MAGNETIC RESONANCE IMAGING SYSTEM

(71) Applicant: Siemens Healthcare GmbH, Erlangen (DE)

(72) Inventors: Yan Tu Huang, Shenzhen (CN); Peter Speier, Erlangen (DE); Tobias Kober, Lausanne (CH); Tom Hilbert, Lausanne (CH)

(73) Assignee: Siemens Healthineers AG, Erlangen (DE)

( * ) Notice: Subject to any disclaimer, the term of this patent is extended or adjusted under 35 U.S.C. 154(b) by 182 days.

(21) Appl. No.: 18/223,577

(22) Filed: Jul. 19, 2023

(65) Prior Publication Data
US 2024/0027559 A1    Jan. 25, 2024

(30) Foreign Application Priority Data
Jul. 19, 2022 (CN) .......................... 202210847405.3

(51) Int. Cl.
*G01R 33/565* (2006.01)
*G01R 33/48* (2006.01)
*G01R 33/561* (2006.01)

(52) U.S. Cl.
CPC ... *G01R 33/56509* (2013.01); *G01R 33/4822* (2013.01); *G01R 33/5611* (2013.01)

(58) Field of Classification Search
CPC ............ G01R 33/4822; G01R 33/5611; G01R 33/56509
See application file for complete search history.

(56) References Cited

U.S. PATENT DOCUMENTS

| 8,542,901 B2 * | 9/2013 | Chang .............. G01R 33/56509 |
| | | 382/131 |
| 9,140,770 B2 | 9/2015 | Odille et al. |
| | | (Continued) |

OTHER PUBLICATIONS

Wilkinson T, Godinez F, Brackenier Y, et al., "Motion Estimation for Brain Imaging at Ultra-High Field Using Pilot-Tone: Comparison with Disorder Motion Compensation," Proc. Intl. Soc. Mag. Reson. Med. 29 (2021).

(Continued)

*Primary Examiner* — Gregory H Curran
(74) *Attorney, Agent, or Firm* — Banner & Witcoff Ltd.

(57) ABSTRACT

A motion correction method may include: calculating a current motion-corrected MR image based on a current motion parameter of an imaging target and K-space measurement data of the imaging target; calculating current motion-corrected K-space data based on the current motion parameter of the imaging target and the current motion-corrected MR image; calculating a current K-space measurement data error based on the K-space measurement data of the imaging target and the current motion-corrected K-space data; and determining, based on the current K-space measurement data error, whether an iteration end condition is met. If so, using the current motion-corrected MR image as a final motion-corrected MR image to be used. Otherwise, updating the current motion parameter of the imaging target based on the current K-space measurement data error and the current motion-corrected MR image. The method advantageously provides an increased motion correction speed of an MR image.

19 Claims, 6 Drawing Sheets

(56) References Cited

U.S. PATENT DOCUMENTS

| | | |
|---|---|---|
| 9,274,198 B2 | 3/2016 | Menini et al. |
| 10,254,367 B2 * | 4/2019 | Koestler .......... G01R 33/56509 |
| 11,519,992 B2 * | 12/2022 | Brada ................ G01R 33/4835 |

OTHER PUBLICATIONS

Andre JB, Bresnahan BW, Mossa-Basha M, et al., "Toward quantifying the prevalence, severity, and cost associated with patient motion during clinical MR examinations," J Am Coll Radiol., 12(7):689-695; (2015).

Walsh, David O., Arthur F. Gmitro, and Michael W. Marcellin, "Adaptive reconstruction of phased array MR imagery," Magnetic Resonance in Medicine: An Official Journal of the International Society for Magnetic Resonance in Medicine 43.5: 682-690; (2000).

Odille et al., "Generalized Reconstruction by Inversion of Coupled Systems (GRICS) Applied to Free-Breathing MRI," Magnetic Resonance in Medicine 60, pp. 146-157; (2008).

Wallace, Tess E., et al. "Head motion measurement and correction using FID navigators." Magnetic resonance in medicine 81.1: pp. 1-17; (Jan. 2019).

Cordero-Grande, Lucilio et al., "Sensitivity Encoding for Aligned Multishot Magnetic Resonance Reconstruction," IEEE Transactions on Computational Imaging, vol. 2, No. 3, pp. 266-280 (Sep. 2016).

Kober T. et al; "Head Motion Detection Using FID Navigators," Magnetic Resonance in Medicine; vol. 66; pp. 135-143; (2012).

Menini A, Vuissoz P-A, Felblinger J, Odille F., "Joint Reconstruction of Image and Motion in MRI: Implicit Regularization Using an Adaptive 3D Mesh," Lecture Notes in Computer Science (Including Subseries Lecture Notes in Artificial Intelligence and Lecture Notes in Bioinformatics). vol. 7510 LNCS; 2012:264-271; (2012).

Speier P, Bacher M, Bollenbeck J, Fenchel M, Kober T., "Separation and Quantification of Head Motion Modes by Pilot Tone Measurement," ISMRM 2018 Paris, Abstract #4101 (2018).

Polak, D. et al, "Scout Acquisition Enables Rapid Motion Estimation (SAME) for Fully Separable Retrospective Motion Mitigation," Proceedings of ISMRM 28th Annual Meeting, (2020).

* cited by examiner

MOTION CORRECTION METHOD AND APPARATUS FOR MAGNETIC RESONANCE IMAGE, AND MAGNETIC RESONANCE IMAGING SYSTEM

CROSS REFERENCE TO RELATED APPLICATIONS

This patent application claims priority to Chinese Patent Application No. 202210847405.3, filed Jul. 19, 2022, which is incorporated herein by reference in its entirety.

BACKGROUND

Field

The present disclosure relates to the technical field of magnetic resonance imaging (MRI), and in particular, to a motion correction method and apparatus for a magnetic resonance (MR) image, and an MRI system.

Related Art

For MRI, it is assumed that an imaging object (that is, a patient) remains absolutely still during collection. Typical MRI scanning lasts for a few minutes to a dozen minutes, during which the imaging object is likely to move. This may cause a motion artifact and thus affect image quality, and may even lead to generation of non-diagnostic data, requiring rescanning. As a result, a total scanning time is prolonged, comfort for the imaging object is reduced, and significant costs are incurred. Therefore, motion is one of the major problems to be resolved in MRI.

Motion correction technologies can be classified into a prospective method and a retrospective method.

In the prospective method, a motion parameter needs to be detected in real time, and a field of view needs to be corrected (that is, an imaging body part and motion simultaneously move). During sequence scanning, motion may be detected by using a camera system or a so-called "navigator" (that is, collecting data in a short time to determine a motion state of the imaging body part) that is installed in an MRI instrument. Although some systems may be very precise, they require expensive additional hardware (for example, the camera system) or a significant change in an imaging sequence (for example, the navigator). This typically prolongs a collection time and/or affects the image itself.

The retrospective method tries to reconstruct an artifact-free image from motion-damaged measurement data. A general idea is to describe image reconstruction as an optimization problem, and an objective function is to minimize the motion artifact. One type of retrospective motion correction algorithm is model-based reconstruction. In some technologies, a nonlinear solver can be used to correct rigid body motion (six degrees of freedom), which makes the technologies computationally expensive and slow. In some of these technologies, guided scanning is used to estimate an acceleration motion parameter. One popular method for non-rigid body motion correction is generalized reconstruction by inversion of coupled systems (GRICS), in which an external motion signal such as electrocardiography (ECG) is used, especially in the context of heart and abdomen imaging. However, a manner of formulating a motion correction problem in the GRICS involves a large number of parameters, which makes it difficult to solve the problem. An improvement in the GRICS is to reduce the number of unknown parameters by constructing a three-dimensional grid. However, additional overheads are caused.

Although the external motion signal (such as an ECG or respiratory belt signal) is used in the GRICS to learn a motion model parameterized by the signal, an attempt is made to directly derive a motion parameter from the external motion signal in some technologies. An example is a free induction decay navigator (FIDNAV), which obtains a global MR signal by using a simple and very fast method, and estimates motion through linear regression or by using a second-order polynomial regression model. Another motion information signal that does not cause additional overheads is a pilot tone signal, which has been used for motion correction in brain imaging by means of a forward linear model. The FIDNAV and the pilot tone signal have little or no impact on an MR sequence and achieves a high obtaining speed and low costs, but they still lack sufficient detection precision in spite of being related to motion that occurs.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
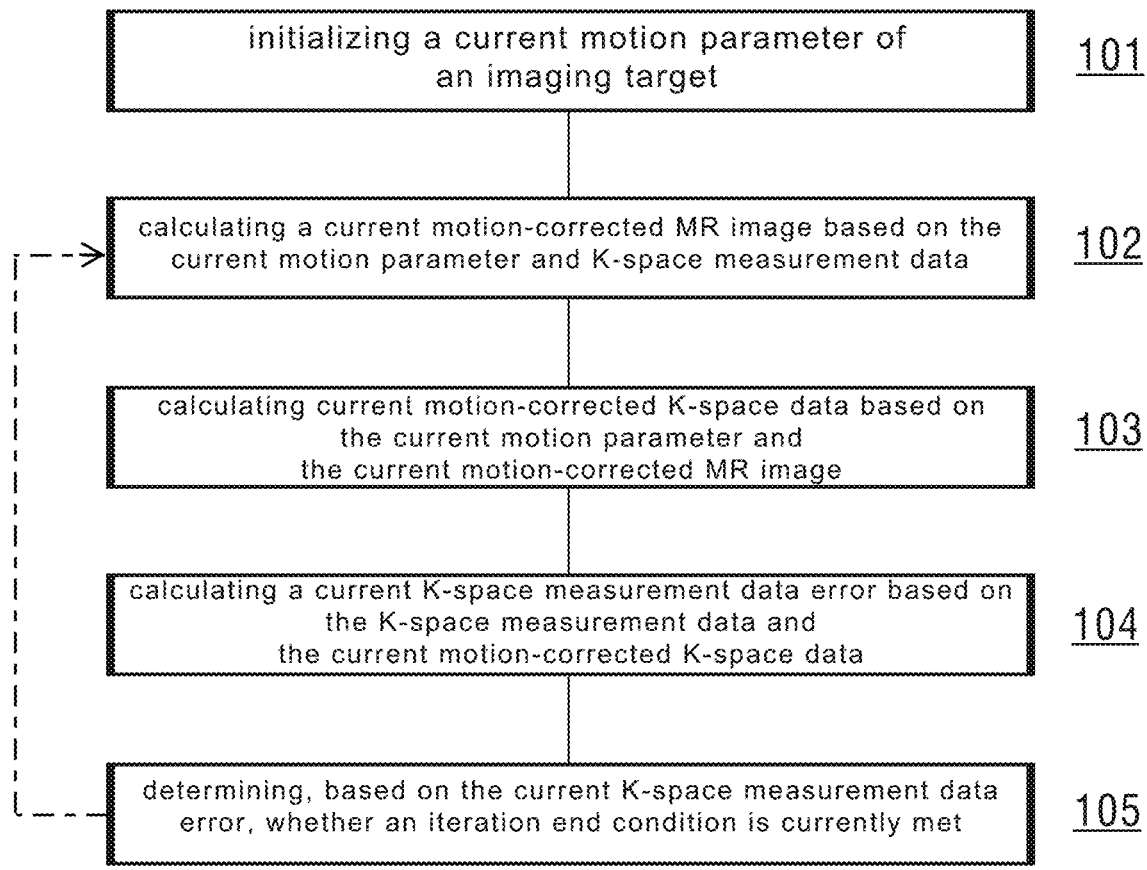
FIG. 1 is a flowchart of a motion correction method for an MR image according to an embodiment of the present disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

In view of this, embodiments of the present disclosure provide a motion correction method for a magnetic resonance (MR) image, and further provide a motion correction apparatus for an MR image and an MRI system, to increase a motion correction speed of the MR image while ensuring motion correction precision of the MR image.

A motion correction method for a magnetic resonance image may include:

initializing a current motion parameter of an imaging target;

calculating a current motion-corrected magnetic resonance (MR) image based on the current motion parameter of the imaging target and K-space measurement data of the imaging target;

calculating current motion-corrected K-space data based on the current motion parameter of the imaging target and the current motion-corrected MR image;

calculating a current K-space measurement data error based on the K-space measurement data of the imaging target and the current motion-corrected K-space data; and determining, based on the current K-space measurement data error, whether an iteration end condition is currently met, and if the iteration end condition is currently met, using the current motion-corrected MR image as a final motion-corrected MR image to be used, otherwise updating the current motion parameter of the imaging target based on the current K-space measurement data error and the current motion-corrected MR image, and returning to perform the action of calculating a current motion-corrected MR image based on the current motion parameter of the imaging target and K-space measurement data of the imaging target.

The initializing a current motion parameter of an imaging target may include: initializing the current motion parameter of the imaging target as a zero vector.

The current motion parameter of the imaging target is relative displacement of the imaging target during a current iteration process relative to a previous iteration process.

The calculating a current motion-corrected MR image based on the current motion parameter of the imaging target and K-space measurement data of the imaging target may include:

calculating $x_i$ according to $y=AFST(a_i)x_i$, where y is the K-space measurement data of the imaging target, A is a K-space sampling mode mask, F is a fast Fourier transform operator, S is receive coil sensitivity, $a_i$ is the current motion parameter of the imaging target, $T(a_i)$ is a conversion function for applying $a_i$ to an image $x_i$ to generate a motion-corrected image, $x_i$ is the current motion-corrected MR image, and i is an iteration sequence number.

The calculating current motion-corrected K-space data based on the current motion parameter of the imaging target and the current motion-corrected MR image may include:

calculating $y_i$ according to $y_i=AFST(a_i)x_i$, where $y_i$ is the current motion-corrected K-space data, A is a K-space sampling mode mask, F is a fast Fourier transform operator, S is receive coil sensitivity, $a_i$ is the current motion parameter of the imaging target, $T(a_i)$ is a conversion function for applying $a_i$ to an image $x_i$ to generate a motion-corrected image, $x_i$ is the current motion-corrected MR image, and i is an iteration sequence number.

The updating the current motion parameter of the imaging target based on the current K-space measurement data error and the current motion-corrected MR image may include:

calculating the updated current motion parameter $a_{i+1}$ of the imaging target according to $r_i=AFSG(x_i)D\Delta a_i$, with $a_{i+1}=a_i+\Delta a_i$, where $r_i$ is the current K-space measurement data error, A is a K-space sampling mode mask, F is a fast Fourier transform operator, S is receive coil sensitivity, $x_i$ is the current motion-corrected MR image, $G(x_i)$ is a gradient of $x_i$, D is a preset motion displacement field, $a_i$ is the current motion parameter of the imaging target, $\Delta a_i$ is a current incremental motion parameter, and i is an iteration sequence number.

The current motion parameter of the imaging target is a current coefficient vector of an external motion signal of the imaging target.

The calculating a current motion-corrected MR image based on the current motion parameter of the imaging target and K-space measurement data of the imaging target may include: calculating the current motion-corrected MR image based on an external motion signal of the imaging target during an MR imaging process, a current coefficient vector of the external motion signal, and the K-space measurement data of the imaging target.

The calculating current motion-corrected K-space data based on the current motion parameter of the imaging target and the current motion-corrected MR image may include: calculating the current motion-corrected K-space data based on the external motion signal, the current coefficient vector of the external motion signal, and the current motion-corrected MR image.

The updating the current motion parameter of the imaging target based on the current K-space measurement data error and the current motion-corrected MR image may include: updating the current coefficient vector of the external motion signal based on the current K-space measurement data error, the current motion-corrected MR image, and the external motion signal.

The calculating the current motion-corrected MR image based on an external motion signal of the imaging target during an MR imaging process, a current coefficient vector of the external motion signal, and the K-space measurement data of the imaging target may include:

calculating $x_i$ according to $y=AFST(Pm_i)x_i$, where y is the K-space measurement data of the imaging target, A is a K-space sampling mode mask, F is a fast Fourier transform operator, S is receive coil sensitivity, P is the external motion signal, $m_i$ is the current coefficient vector of the external motion signal, $T(Pm_i)$ is a conversion function for applying $Pm_i$ to an image $x_i$ to generate a motion-corrected image, $x_i$ is the current motion-corrected MR image, and i is an iteration sequence number.

The calculating the current motion-corrected K-space data based on the external motion signal, the current coefficient vector of the external motion signal, and the current motion-corrected MR image may include:

calculating $y_i$ according to $y_i=AFST(Pm_i)x_i$, where $y_i$ is the current motion-corrected K-space data, A is a K-space sampling mode mask, F is a fast Fourier transform operator, S is receive coil sensitivity, P is the external motion signal, $m_i$ is the current coefficient vector of the external motion signal, $T(Pm_i)$ is a conversion function for applying $Pm_i$ to an image $x_i$ to generate a motion-corrected image, $x_i$ is the current motion-corrected MR image, and i is an iteration sequence number.

The updating the current coefficient vector of the external motion signal based on the current K-space measurement data error, the current motion-corrected MR image, and the external motion signal may include:

calculating the updated current coefficient vector $m_{i+1}$ of the external motion signal according to $r_i=AFSG(x_i)$ $DP\Delta m_i$, with $m_{i+1}=m_i+\Delta m_i$, where $r_i$ is the current K-space measurement data error, A is a K-space sampling mode mask, F is a fast Fourier transform operator, S is receive coil sensitivity, $x_i$ is the current motion-corrected MR image, $G(x_i)$ is a gradient of $x_i$, D is a preset motion displacement field, P is the external motion signal, $m_i$ is the current coefficient vector of the external motion signal, $\Delta m_i$ is a current incremental coefficient vector of the external motion signal, and i is an iteration sequence number.

The calculating a current K-space measurement data error based on the K-space measurement data of the imaging target and the current motion-corrected K-space data may include: using a difference between the K-space measurement data of the imaging target and the current motion-corrected K-space data as the current K-space measurement data error.

The determining, based on the current K-space measurement data error, whether an iteration end condition is currently met may include:

determining whether the current K-space measurement data error falls within a preset first range, and if the current K-space measurement data error falls within the preset first range, determining that the iteration end condition is currently met; or determining whether a difference between the current K-space measurement data error and a K-space measurement data error occurring during a previous iteration process falls within a preset second range, and if the difference falls within the preset second range, determining that the iteration end condition is currently met.

When the imaging target includes a plurality of parts whose motion models are independent of each other, the initializing a current motion parameter of an imaging target may include: separately setting a respective current motion parameter for each part, and separately initializing the current motion parameter of each part, where the current motion parameters of all the parts constitute the current motion parameter of the imaging target.

When the final motion-corrected MR image to be used has a lower resolution than a required resolution, after the using the current motion-corrected MR image as a final motion-corrected MR image to be used, the method may further include:

separately multiplying, based on a ratio between the required resolution and the resolution of the final motion-corrected MR image to be used, each translation parameter or each translation parameter and each shear parameter in the current motion parameter by the ratio, to obtain the updated current motion parameter; and when K-space measurement data of the imaging target that corresponds to the required resolution is collected, calculating the current motion-corrected MR image based on the updated current motion parameter and the collected K-space measurement data.

A motion correction apparatus for a magnetic resonance image may include:

an initialization module configured to initialize a current motion parameter of an imaging target;

an MR image correction module configured to calculate a current motion-corrected magnetic resonance (MR) image based on the current motion parameter of the imaging target and K-space measurement data of the imaging target;

a K-space data correction module configured to calculate current motion-corrected K-space data based on the current motion parameter of the imaging target and the current motion-corrected MR image;

an error calculation module configured to calculate a current K-space measurement data error based on the K-space measurement data of the imaging target and the current motion-corrected K-space data; and a determination module configured to: determine, based on the current K-space measurement data error, whether an iteration end condition is currently met, and if the iteration end condition is currently met, use the current motion-corrected MR image as a final motion-corrected MR image to be used, otherwise update the current motion parameter of the imaging target based on the current K-space measurement data error and the current motion-corrected MR image, and send the updated current motion parameter of the imaging target to the MR image correction module and the K-space data correction module.

A magnetic resonance imaging system may include a motion correction apparatus for a magnetic resonance image as described above. In an exemplary embodiment, the system may further include a scanner.

In the embodiments of the present disclosure, the current motion-corrected MR image is calculated based on the current motion parameter of the imaging target and the K-space measurement data of the imaging target. Then, the current motion-corrected K-space data is calculated based on the current motion parameter of the imaging target and the current motion-corrected MR image. Subsequently, the current K-space measurement data error is calculated based on the K-space measurement data of the imaging target and the current motion-corrected K-space data. When it is determined, based on the current K-space measurement data error, that the iteration end condition is currently met, the current motion-corrected MR image is used as the final motion-corrected MR image to be used. Therefore, motion correction is performed on an MR image by using fewer parameters, which increases a motion correction speed of the MR image while ensuring motion correction precision of the MR image.

FIG. 1 is a flowchart of a motion correction method for an MR image according to an embodiment of the present disclosure. Specific steps of the method are as follows:

step 101 of initializing a current motion parameter of an imaging target;

step 102 of calculating a current motion-corrected MR image based on the current motion parameter of the imaging target and K-space measurement data of the imaging target;

step 103 of calculating current motion-corrected K-space data based on the current motion parameter of the imaging target and the current motion-corrected MR image;

step 104 of calculating a current K-space measurement data error based on the K-space measurement data of the imaging target and the current motion-corrected K-space data; and step 105 of determining, based on the current K-space measurement data error, whether an iteration end condition is currently met, and if the iteration end condition is currently met, using the current motion-corrected MR image as a final motion-corrected MR image to be used, otherwise updating the current motion parameter of the imaging target based on the current K-space measurement data error and the current motion-corrected MR image, and then returning to step 102.

In the above embodiment, the current motion-corrected MR image is calculated based on the current motion parameter of the imaging target and the K-space measurement data of the imaging target. Then, the current motion-corrected K-space data is calculated based on the current motion parameter of the imaging target and the current motion-corrected MR image. Subsequently, the current K-space measurement data error is calculated based on the K-space measurement data of the imaging target and the current motion-corrected K-space data. When it is determined, based on the current K-space measurement data error, that the iteration end condition is currently met, the current motion-corrected MR image is used as the final motion-corrected MR image to be used. Therefore, motion correction is performed on an MR image by using fewer parameters, which increases a motion correction speed of the MR image while ensuring motion correction precision of the MR image.

In an exemplary embodiment, in step 101, the initializing a current motion parameter of an imaging target may include: initializing the current motion parameter of the imaging target as a zero vector.

In an exemplary embodiment, the current motion parameter of the imaging target is relative displacement of the imaging target during a current iteration process relative to a previous iteration process.

Because a single imaging process may include a plurality of instances of excitation, in this embodiment of the present disclosure, the relative displacement of the imaging target is separately measured for each instance of excitation. For different motion manners of the imaging target, different motion models are used for the relative displacement, which is specifically described as follows:

1) When the motion manner of the imaging target is two-dimensional rigid body motion, and a two-dimensional rigid body motion plane of the imaging target coincides with a measurement plane in a current instance of excitation, a two-dimensional rigid body motion model may be used as a motion model for the imaging target in each instance of excitation, and then the relative displacement in each instance of excitation has three degrees of freedom of motion, including two translations (horizontal displacement and perpendicular displacement) and one rotation angle.

2) When the motion manner of the imaging target is two-dimensional rigid body motion, and a two-dimensional rigid body motion plane of the imaging target does not coincide with a measurement plane in a current instance of excitation, an affine motion model of non-rigid body motion may be used as a motion model for the imaging target in each instance of excitation, and then the relative displacement in each instance of excitation has two or three degrees of freedom of motion, including translation and shear, or including translation, shear, and scaling.

3) When the motion manner of the imaging target is three-dimensional rigid body motion, a three-dimensional rigid body motion model may be used as a motion model for the imaging target in a current instance of excitation, and then the relative displacement in the current instance of excitation has six degrees of freedom of motion, including three translations and three rotation angles, where the three translations are horizontal (x-direction) displacement, perpendicular (y-direction) displacement, and vertical (z-direction) displacement, and the three rotation angles are a rotation angle around a horizontal axis (x-axis), a rotation angle around a perpendicular axis (y-axis), and a rotation angle around a vertical axis (z-axis).

4) When the motion manner of the imaging target is non-rigid body motion, an affine motion model of non-rigid body motion may be used as a motion model for the imaging target in each instance of excitation, and the relative displacement in each instance of excitation has two or three degrees of freedom of motion, including translation and shear, or including translation, shear, and scaling.

In an exemplary embodiment, in step 102, the calculating a current motion-corrected MR image based on the current motion parameter of the imaging target and K-space measurement data of the imaging target may include: calculating $x_i$ according to the following formula (1):

$$y = AFST(a_i)x_i \qquad (1)$$

where y is the K-space measurement data of the imaging target, A is a K-space sampling mode mask, F is a fast Fourier transform operator, S is receive coil sensitivity, $a_i$ is the current motion parameter of the imaging target, $T(a_i)$ is a conversion function for applying $a_i$ to an image $x_i$ to generate a motion-corrected image, $x_i$ is the current motion-corrected MR image, and i is an iteration sequence number.

In an exemplary embodiment, in step 103, the calculating current motion-corrected K-space data based on the current motion parameter of the imaging target and the current motion-corrected MR image may include: calculating $y_i$ according to the following formula (2):

$$y_i = AFST(a_i)x_i \qquad (2)$$

where $y_i$ is the current motion-corrected K-space data, A is a K-space sampling mode mask, F is a fast Fourier transform operator, S is receive coil sensitivity, $a_i$ is the current motion parameter of the imaging target, $T(a_i)$ is a conversion function for applying $a_i$ to an image $x_i$ to generate a motion-corrected image, $x_i$ is the current motion-corrected MR image, and i is an iteration sequence number.

In an exemplary embodiment, in step 105, the updating the current motion parameter of the imaging target based on the current K-space measurement data error and the current motion-corrected MR image may include: calculating the updated current motion parameter $a_{i+1}$ of the imaging target according to the following formula (3), with $a_{i+1} = \Delta a_i$, $$r_i = AFSG(x_i)D\Delta a_i \qquad (3)$$

where $r_i$ is the current K-space measurement data error, A is a K-space sampling mode mask, F is a fast Fourier transform operator, S is receive coil sensitivity, $x_i$ is the current motion-corrected MR image, $G(x_i)$ is a gradient of $x_i$, D is a preset motion displacement field, $a_i$ is the current motion parameter of the imaging target, $\Delta a_i$ is a current incremental motion parameter, and i is an iteration sequence number.

In an exemplary embodiment, the current motion parameter of the imaging target is a current coefficient vector of an external motion signal of the imaging target.

In step 102, the calculating a current motion-corrected MR image based on the current motion parameter of the imaging target and K-space measurement data of the imaging target may include: calculating the current motion-corrected MR image based on an external motion signal of the imaging target during an MR imaging process, a current coefficient vector of the external motion signal, and the K-space measurement data of the imaging target.

In step 103, the calculating current motion-corrected K-space data based on the current motion parameter of the imaging target and the current motion-corrected MR image may include: calculating the current motion-corrected K-space data based on the external motion signal, the current coefficient vector of the external motion signal, and the current motion-corrected MR image.

In step 105, the updating the current motion parameter of the imaging target based on the current K-space measurement data error and the current motion-corrected MR image may include: updating the current coefficient vector of the external motion signal based on the current K-space measurement data error, the current motion-corrected MR image, and the external motion signal.

The external motion signal may be obtained by using an existing method, and details are not described in the present disclosure.

In an exemplary embodiment, in step 102, the calculating the current motion-corrected MR image based on an external motion signal of the imaging target during an MR imaging process, a current coefficient vector of the external motion signal, and the K-space measurement data of the imaging target may include: calculating $x_i$ according to the following formula (4):

$$y = AFST(Pm_i)x_i \quad (4)$$

where y is the K-space measurement data of the imaging target, A is a K-space sampling mode mask, F is a fast Fourier transform operator, S is receive coil sensitivity, P is the external motion signal, $m_i$ is the current coefficient vector of the external motion signal, $T(Pm_i)$ is a conversion function for applying $Pm_i$ to an image $x_i$ to generate a motion-corrected image, $x_i$ is the current motion-corrected MR image, and i is an iteration sequence number. It should be noted that $Pm_i$ is $a_i$.

In an exemplary embodiment, in step 103, the calculating the current motion-corrected K-space data based on the external motion signal, the current coefficient vector of the external motion signal, and the current motion-corrected MR image may include: calculating $y_i$ according to the following formula (5):

$$y_i = AFST(Pm_i)x_i \quad (5)$$

where $y_i$ is the current motion-corrected K-space data, A is a K-space sampling mode mask, F is a fast Fourier transform operator, S is receive coil sensitivity, P is the external motion signal, $m_i$ is the current coefficient vector of the external motion signal, $T(Pm_i)$ is a conversion function for applying $Pm_i$ to an image $x_i$ to generate a motion-corrected image, $x_i$ is the current motion-corrected MR image, and i is an iteration sequence number.

In an exemplary embodiment, in step 105, the updating the current coefficient vector of the external motion signal based on the current K-space measurement data error, the current motion-corrected MR image, and the external motion signal may include:

calculating the updated current coefficient vector $m_{i+1}$ of the external motion signal according to the following formula (6), with $m_{i+1} = m_i + \Delta m_i$:

$$r_i = AFSG(x_i)DP\Delta m_i \quad (6)$$

where $r_i$ is the current K-space measurement data error, A is a K-space sampling mode mask, F is a fast Fourier transform operator, S is receive coil sensitivity, $x_i$ is the current motion-corrected MR image, $G(x_i)$ is a gradient of $x_i$, D is a preset motion displacement field, P is the external motion signal, $m_i$ is the current coefficient vector of the external motion signal, $\Delta m_i$ is a current incremental coefficient vector of the external motion signal, and i is an iteration sequence number.

All parameters in the above formulas (1) to (6) may be represented by a matrix. For example:

1) $x_i$ has a size of Ne*1, Ne being a number of voxels in $x_i$, and i being an iteration sequence number.
2) A may be represented as a matrix with a size of (Ne*Nc)*(Ne*Ns*Nc), where Nc is a number of receive coils, and Ns is a number of instances of excitation:

$$A = \begin{bmatrix} A' & \cdots & 0 \\ \vdots & \ddots & \vdots \\ 0 & \cdots & A' \end{bmatrix}$$

where A is a diagonal matrix, there are a number Nc of elements on a main diagonal of A, each element is A', and A'=[$A_1$ $A_2$ ... $A_{Ns}$], where Ac (c=1, 2, ..., Ns) is a diagonal matrix, and a vector on a main diagonal of Ac comes from a vector e, for example, $$e = \begin{bmatrix} 0 \\ 0 \\ \vdots \\ 1 \\ \vdots \\ 1 \\ 0 \\ 0 \end{bmatrix}.$$

If a value of the element is 1, it indicates that sampling is performed at a corresponding K-space position in current excitation. If a value of the element is 0, it indicates that no sampling is performed at a corresponding K-space position in current excitation.

$$F = \begin{bmatrix} F_1 & \cdots & 0 \\ \vdots & \ddots & \vdots \\ 0 & \cdots & F_1 \end{bmatrix}, \quad 3)$$

where F is a diagonal matrix of Ns*Nc, each element on a diagonal is F1, and F1 is a matrix that is used to perform a Fourier transform (FFT) on an image and that has a size of Ne*Ne. Therefore, F has a total size of (Ns*Nc*Ne)*(Ns*Nc*Ne).

4) S may be represented as a matrix with a size of (Ne*Ns*Nc)*(Ne*Ns):

$$S = \begin{bmatrix} \begin{bmatrix} S_1 & \cdots & 0 \\ \vdots & \ddots & \vdots \\ 0 & \cdots & S_1 \end{bmatrix} \\ \begin{bmatrix} S_2 & \cdots & 0 \\ \vdots & \ddots & \vdots \\ 0 & \cdots & S_2 \end{bmatrix} \\ \vdots \\ \begin{bmatrix} S_{Nc} & \cdots & 0 \\ \vdots & \ddots & \vdots \\ 0 & \cdots & S_{Nc} \end{bmatrix} \end{bmatrix}$$

where $$Sc = \begin{bmatrix} s_1 & \cdots & 0 \\ \vdots & \ddots & \vdots \\ 0 & \cdots & s_{Ne} \end{bmatrix},$$

c=1, 2, . . . , Nc, Sc is a diagonal matrix, and each element on a main diagonal of Sc comes from a sensitivity map vector $$\begin{bmatrix} s_1 \\ s_2 \\ \vdots \\ s_{Ne} \end{bmatrix}$$

of a receive coil c.

5) $a_i$ may be represented as a matrix with a size of (Nl*Ns)*1, where Nl is a number of degrees of freedom of motion:

$$a_i = \begin{bmatrix} a_{i,1} \\ a_{i,2} \\ \vdots \\ a_{i,Ns} \end{bmatrix}$$

$$a_{i,s} = \begin{bmatrix} a_{i,s1} \\ a_{i,s2} \\ \vdots \\ a_{i,sNl} \end{bmatrix}, \text{ and } s = 1, 2, \ldots, Ns.$$

6) $T(a_i)$ may be represented as a matrix with a size of (Ne*Ns)*Ne:

$$T(a_i) = \begin{bmatrix} T_1(a_{i,1}) \\ T_2(a_{i,2}) \\ \vdots \\ T_{Ns}(a_{i,Ns}) \end{bmatrix}$$

where $T_s(a_{i,s})$ has a size of Ne*Ne, with s=1, 2, . . . , Ns.

A value of an element in a $k_h^{th}$ column in a $k'^{th}$ (k'=1, 2, . . . , Ne) row of $T_s(a_{i,s})$ is $c_h$ (h=1, 2, . . . , b), and values of elements, other than the $k_h^{th}$ (h=1, 2, . . . , b) column, in the $k'^{th}$ (k'=1, 2, . . . , Ne) row are 0, where k=floor (k'−(Da$_{i,s}$)$_{k'}$), D is a preset displacement field, (Da$_{i,s}$)$_{k'}$ represents a $k'^{th}$ element of Da$_{i,s}$, and $k_h$ (h=1, 2, . . . , b) has a preset position relationship with k. For example, if the MR image has a size of d*d, Ne=d*d, and when b=4, then $k_1$=k−d, $k_2$=k−1, $k_3$=k+1, and $k_4$=k+d, that is, $k_1$, $k_2$, $k_3$, and $k_4$ correspond to four voxels around k (up, left, right, and down) on the MR image. floor is a rounded-down operator.

$c_h$ (h=1, 2, . . . , b) is actually an interpolation coefficient, a specific value of which is determined depending on a used interpolation algorithm. The interpolation algorithm may be an existing linear interpolation algorithm, etc.

A physical meaning of $T_s(a_{i,s})$ is explained by way of example:

It is assumed that $z_{i,s}=T_s(a_{i,s})x_i$, where $z_{i,s}$ is an image obtained after performing motion correction on $x_i$.

For any voxel on the image $z_{i,s}$, it is assumed that a position of the voxel in the image $z_{i,s}$ is k', and a position of the voxel in the image $x_i$ is k. In this case, k=k'−(u$_{i,s}$)$_{k'}$=k'−(Da$_{i,s}$)$_{k'}$, where D is a preset displacement field, and (u$_{i,s}$)$_{k'}$ represents displacement of the voxel. A preset number of voxels (for example, four voxels, i.e. up, down, left, and right) around the voxel (at the position k) is found from the image $x_i$, and interpolation is performed on MR values of the preset number of voxels to obtain an MR value of the voxel (at the position k') in the image $z_{i,s}$. The interpolation method may be an existing interpolation method, such as linear interpolation.

7) $G(x_i)$ may be represented as a matrix with a size of (Ns*Ne)*(Ns*Ne):

$$G(x_i) = \begin{bmatrix} G_1 & \cdots & 0 \\ \vdots & \ddots & \vdots \\ 0 & \cdots & G_{Ns} \end{bmatrix}.$$

8) D may be represented as a matrix with a size of (Ns*Ne)*(Ns*Nl):

$$D = \begin{bmatrix} D_1 & \cdots & 0 \\ \vdots & \ddots & \vdots \\ 0 & \cdots & D_{Ns} \end{bmatrix}, Ds = [d_1 \ d_2 \ \cdots \ d_{Nl}], \text{ and } s = 1, 2, \ldots, Ns,$$

where D corresponding to each instance of excitation may be defined based on motion of the imaging target during each instance of excitation, which motion is obtained by performing a plurality of times of measurement in advance.

For different motion models used for the imaging target, D has a different number of degrees of freedom of motion, which is specifically described as follows:

1) When the motion manner of the imaging target is two-dimensional rigid body motion, and a two-dimensional rigid body motion plane of the imaging target coincides with a measurement plane in a current instance of excitation, a two-dimensional rigid body motion model may be used for the imaging target, and then D has three degrees of freedom of motion, including two translations (horizontal displacement and perpendicular displacement) and one rotation angle.

2) When the motion manner of the imaging target is two-dimensional rigid body motion, and a two-dimensional rigid body motion plane of the imaging target does not coincide with a measurement plane in a current instance of excitation, an affine motion model of non-rigid body motion may be used for the imaging target, and then D has two or three degrees of freedom of motion, including translation and shear, or including translation, shear, and scaling.

3) When the motion manner of the imaging target is three-dimensional rigid body motion, a three-dimensional rigid body motion model may be used as a motion model for the imaging target, and then D has six degrees of freedom of motion, including three translations and three rotation angles, where the three translations are horizontal (x-direction) displacement, perpendicular (y-direction) displacement, and vertical (z-direction) displacement, and the three rotation angles are a rotation angle around a horizontal axis (x-axis), a rotation angle around a perpendicular axis (y-axis), and a rotation angle around a vertical axis (z-axis).

4) When the motion manner of the imaging target is non-rigid body motion, an affine motion model of non-rigid body motion may be used as a motion model for the imaging target, and then D has two or three degrees of freedom of motion, including translation and shear, or including translation, shear, and scaling.

Figure 2:
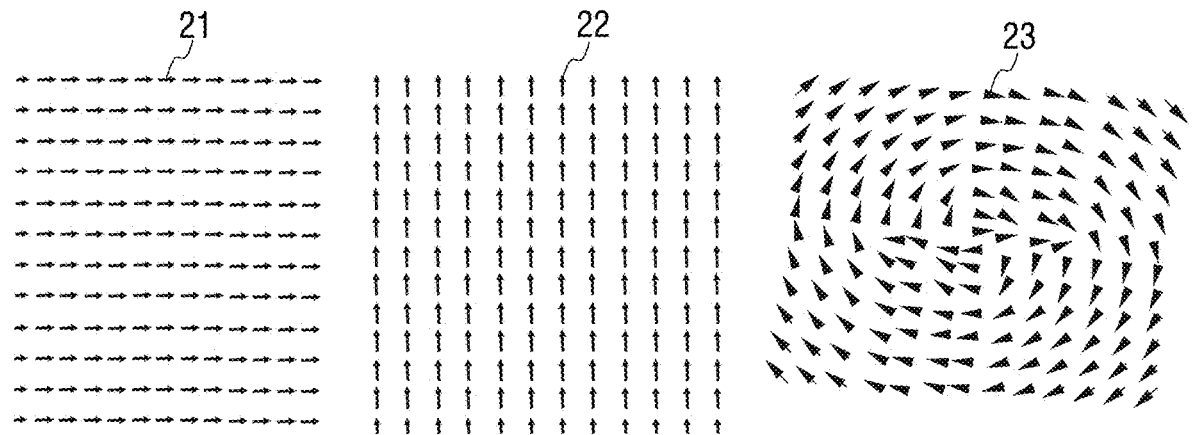
FIG. 2 is an example diagram of a predefined displacement field of when a two-dimensional rigid body motion model is used for an imaging target according to an embodiment of the present disclosure.

FIG. 2 is an example diagram of a predefined displacement field of when a two-dimensional rigid body motion model is used for an imaging target, where 21 represents horizontal translation, 22 represents perpendicular translation, and 23 represents rotation.

9) P may be represented as a matrix with a size of (Ns*Nl)*(Nl*N'c):

$$P = \begin{bmatrix} P_1 \\ P_2 \\ \vdots \\ P_{Ns} \end{bmatrix}, \text{ and } Ps = \begin{bmatrix} p_s & \cdots & 0 \\ \vdots & \ddots & \vdots \\ 0 & \cdots & p_s \end{bmatrix},$$

where $P_s$ is a diagonal matrix, there are a number Nl of elements on a main diagonal, and each main diagonal element is $p_s$.

$p_s$ is a row vector of an external motion signal with a size of 1*N'c, where N'c is a number of channels (that is, receive coils) of the external motion signal, and if the channels are not compressed, N'c=Nc, otherwise N'c<Nc.

10) $m_i$ may be represented as a matrix with a size of (N'c*Nl)*1.

A matrix size of $T(Pm_i)$ is the same as that of $T(a_i)$, and is also (Ne*Ns)*Ne.

In an exemplary embodiment, in step 104, the calculating a current K-space measurement data error based on the K-space measurement data of the imaging target and the current motion-corrected K-space data may include: using a difference between the K-space measurement data of the imaging target and the current motion-corrected K-space data as the current K-space measurement data error.

In step 105, the determining, based on the current K-space measurement data error, whether an iteration end condition is currently met may include: determining whether the current K-space measurement data error falls within a preset first range, and if the current K-space measurement data error falls within the preset first range, determining that the iteration end condition is currently met; or determining whether a difference between the current K-space measurement data error and a K-space measurement data error occurring during a previous iteration process falls within a preset second range, and if the difference falls within the preset second range, determining that the iteration end condition is currently met. The first preset range and the second preset range may be set based on experience or the like.

For example, RelErrY=$\|r_i\|/\|y\|=\|y-y_i\|/\|y\|$ is calculated, where RelErrY is a relative error, $r_i$ is the current K-space measurement data error, and $\|\ \|$ is a 2-norm operator. If RelErrY is less than a preset first threshold, it is determined that the iteration end condition is currently met.

In an exemplary embodiment, to accelerate iteration convergence, a resolution of an image may be a low resolution during iteration, and after the iteration ends, a motion parameter is converted into a motion parameter adapted to an actual resolution.

That is, when a resolution of the final motion-corrected MR image to be used is less than a required resolution, after using the current motion-corrected MR image as a final motion-corrected MR image to be used, step 105 further may include: separately multiplying, based on a ratio between the required resolution and the resolution of the final motion-corrected MR image to be used, each translation parameter or each translation parameter and each shear parameter in the current motion parameter by the ratio, to obtain the updated current motion parameter (while a parameter other than the translation parameter and the shear parameter remains unchanged); and when K-space measurement data of the imaging target that corresponds to the required resolution is collected, calculating the current motion-corrected MR image based on the updated current motion parameter and the collected K-space measurement data.

When the motion parameter is relative displacement, each translation parameter or each translation parameter and each shear parameter in the current relative displacement is/are separately multiplied by the ratio, to obtain the updated current relative displacement (while the parameter other than the translation parameter and the shear parameter remains unchanged). When the motion parameter is a coefficient vector of an external motion signal, the external motion signal is multiplied by the current coefficient vector of the external motion signal to obtain current relative displacement, and then each translation parameter or each translation parameter and each shear parameter in the current relative displacement is/are separately multiplied by the ratio, to obtain the updated current relative displacement (while the parameter other than the translation parameter and the shear parameter remains unchanged).

It should be noted that, during one MR imaging process, motion models of different parts of the imaging target may be different. For example, for head imaging, the head (without eyes) performs rigid body motion, and the eyes and the neck perform non-rigid body motion. Because values of degrees of freedom of the eyes and the neck are different, displacement fields of the eyes and the neck should be separately set. Therefore, displacement fields may be separately defined for the head (without eyes), the eyes, and the neck. In this case, D is composed of three parts: D1, D2, and D3, where for MR image areas respectively corresponding to D1, D2, and D3, motion correction is separately performed on the MR image areas respectively corresponding to D1, D2, and D3 during the entire iterative correction process, that is, $a_i$ or $m_i$ corresponding to the MR image areas respectively corresponding to D1, D2, and D3 is separately estimated.

Figure 3:
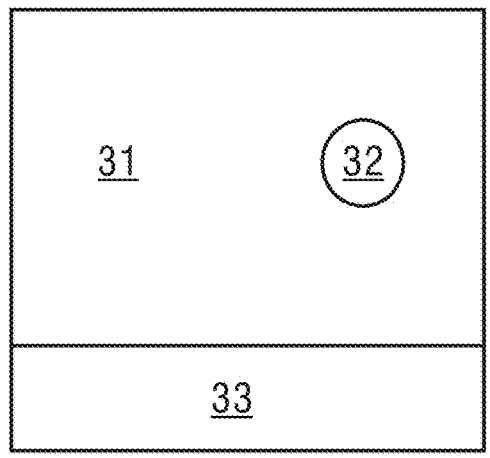
FIG. 3 is a schematic diagram of areas corresponding to different displacement fields in an MR image according to an embodiment of the present disclosure.

FIG. 3 is a schematic diagram of areas corresponding to different displacement fields in an MR image, for example, 31 corresponds to the head (without eyes), 32 corresponds to the eyes, and 33 corresponds to the neck.

In an exemplary embodiment, when the imaging target may include a plurality of parts whose motion models are independent of each other, step 101 specifically may include: separately setting a respective current motion parameter for each part, and separately initializing the current motion parameter of each part, where the current motion parameters of all the parts constitute the current motion parameter of the imaging target.

The external motion signal in this embodiment of the present disclosure may be a pilot tone signal, an acceleration sensing signal, etc. When motion correction is applied to the abdomen or the heart, the external motion signal may also be a respiratory belt signal, an ECG signal, etc.

A simulation experiment in this embodiment of the present disclosure is provided below.

In this simulation experiment, motion correction is performed on a motion-damaged MR image separately by using an existing method, a motion correction method that is not based on an external motion signal according to an embodiment of the present disclosure, and a motion correction method that is based on an external motion signal (a PT signal in this experiment) according to an embodiment of the present disclosure.

If a plurality of external motion signals is obtained in one instance of excitation, an average value of the plurality of external motion signals is used as an external motion signal in the current instance of excitation.

This simulation involves 16 instances of excitation, and sampling is performed by using a Cartesian parallel 1D sampling mode, in which the imaging target performs only rotational motion, with a rotation angle randomly and evenly distributed within [0, +10°].

The image has a size of 128*128.

Channels (that is, receive coils) are compressed to retain 90% of energy, to reduce a number of channels to 5.

Figure 4:
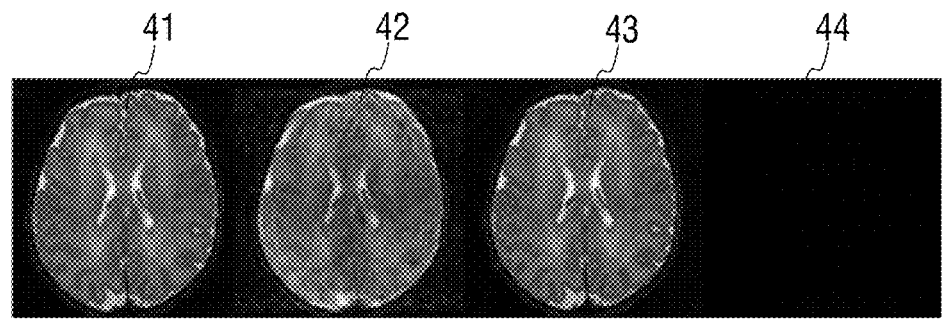
FIG. 4 is a result diagram of a simulation experiment according to an embodiment of the present disclosure.
Figure 4:
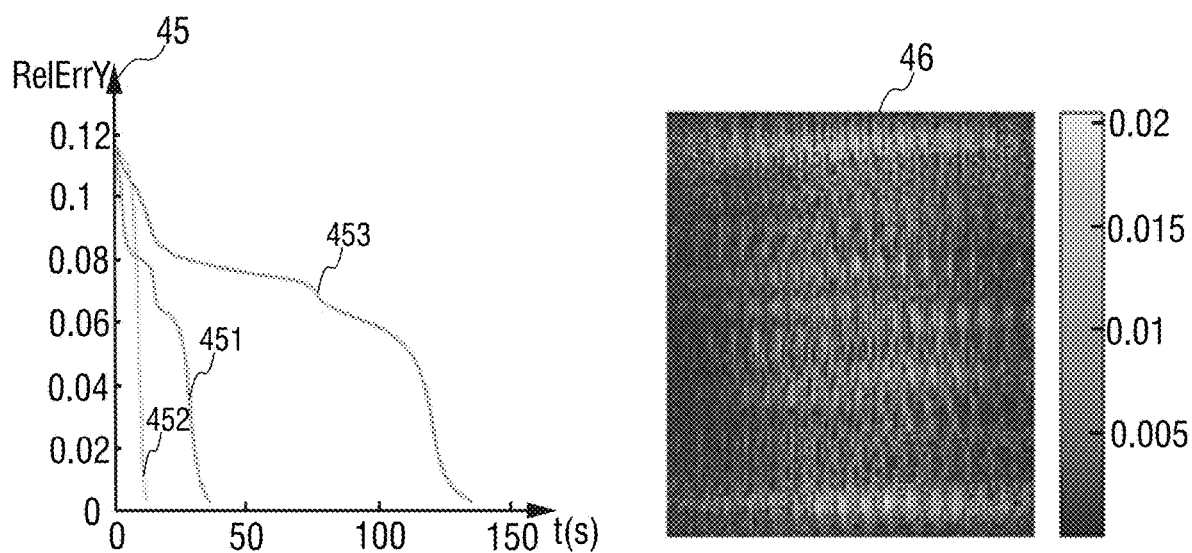

FIG. 4 is a result diagram of this simulation experiment. 41 represents an MR image collected when an imaging target is not moving during an imaging process, 42 represents a motion-damaged MR image collected when the imaging target is moving during the imaging process, 43 represents an image obtained after performing motion correction on 42 by using the motion correction method that is based on an external motion signal according to an embodiment of the present disclosure, and 44 represents an error image obtained by comparing 43 with 41. It can be seen that values of voxels in 44 are all close to 0, which indicates a good correction effect.

45 represents a comparison diagram of errors respectively obtained after performing motion correction on 42 by using the motion correction method that is not based on an external motion signal according to an embodiment of the present disclosure, the motion correction method that is based on an external motion signal according to an embodiment of the present disclosure, and the existing method, where a horizontal coordinate represents scanning duration in unit of s, a vertical coordinate represents RelErrY, 451 represents errors obtained by using the motion correction method that is not based on an external motion signal according to an embodiment of the present disclosure, 452 represents errors obtained by using the motion correction method that is based on an external motion signal according to an embodiment of the present disclosure, and 453 represents errors obtained by using the existing method; and 46 represents a schematic diagram of an error obtained by comparing 43 with 41. It can be seen that the maximum error is not greater than 2%.

A result of an in vivo experiment in this embodiment of the present disclosure is as follows:

In this experiment, MR scanning is performed on the head of a volunteer, and motion correction is performed separately by using the motion correction method that is not based on an external motion signal according to an embodiment of the present disclosure and the motion correction method that is based on an external motion signal (a PT signal in this experiment) according to an embodiment of the present disclosure.

In this experiment, a total number of 17 instances of excitation are included, and 21 echoes are collected in each instance of excitation.

An image size is 357*512, and 14 receive channels (that is, receive coils) are activated.

The volunteer slightly rotates the head during a measurement process.

Figure 5:
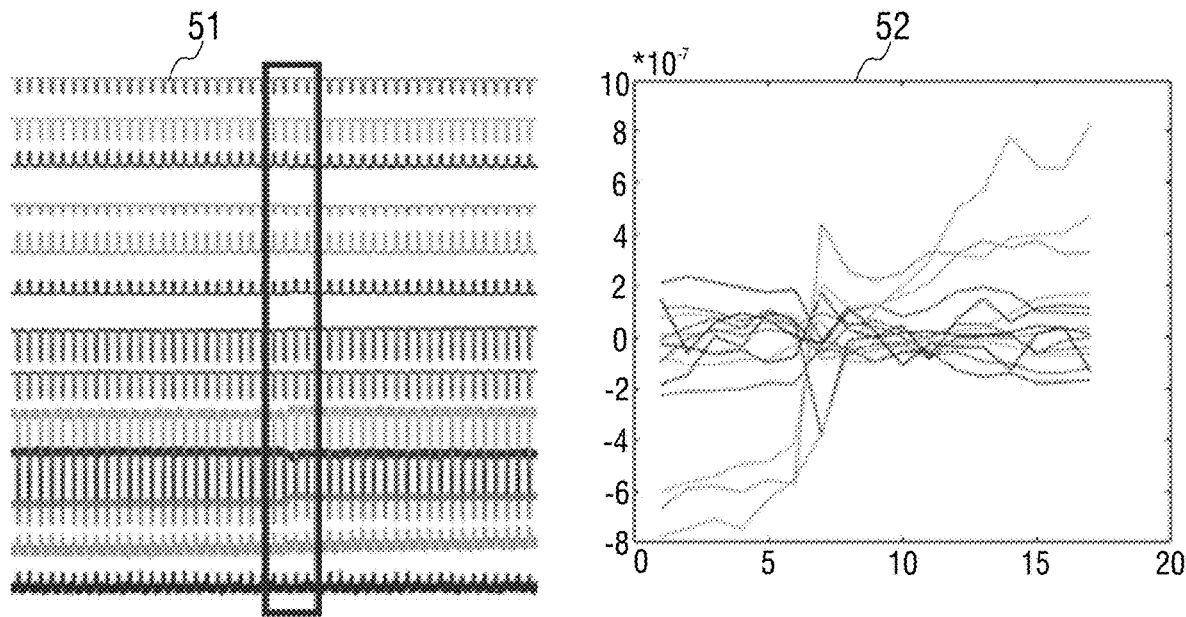
FIG. 5 is a schematic diagram of a PT signal obtained through measurement during an in vivo experiment according to an embodiment of the present disclosure.

FIG. 5 is a schematic diagram of a PT signal measured during this experiment process, where a block in 51 represents spikes caused by an external motion signal such as a radio frequency pulse and a signal change, and 52 is a PT average signal obtained after averaging PT signals collected in one instance of excitation, where a horizontal coordinate represents scanning duration, and a vertical coordinate represents amplitude of the PT average signal.

Figure 6:
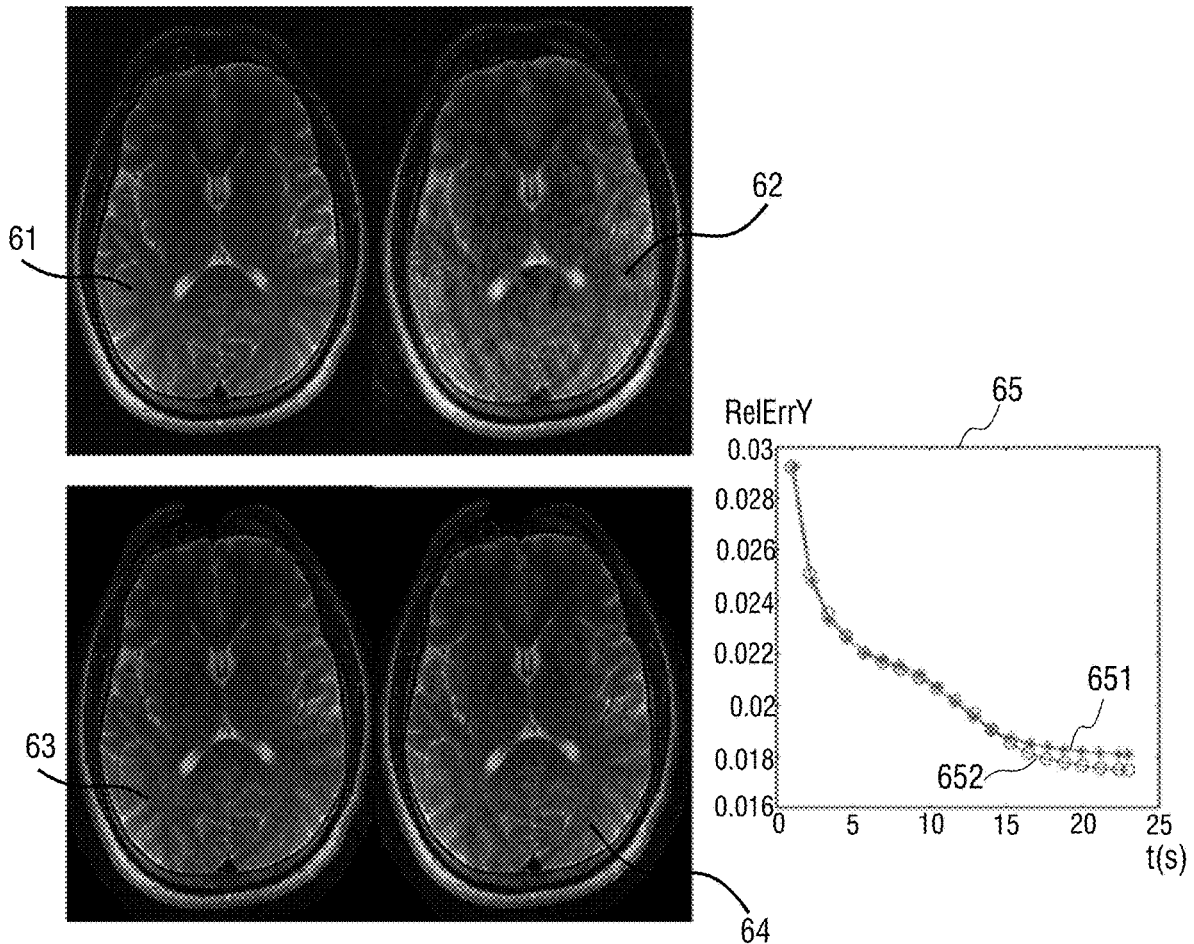
FIG. 6 is a result diagram of an in vivo experiment according to an embodiment of the present disclosure.

FIG. 6 is a result diagram of this experiment, where 61 represents an MR image collected when the imaging target is not moving during the imaging process, 62 represents a motion-damaged MR image collected when the imaging target is moving during the imaging process, 63 represents an image obtained after performing motion correction on 62 by using the method that is based on an external motion signal according to an embodiment of the present disclosure, 64 represents an image obtained after performing motion correction on 62 by using the method that is not based on an external motion signal according to the embodiment of the present disclosure, and 65 represents a comparison diagram of errors obtained after performing motion correction by using the motion correction method that is not based on an external motion signal according to an embodiment of the present disclosure and the motion correction method that is based on an external motion signal according to an embodiment of the present disclosure, where a horizontal coordinate represents scanning duration in unit of s, a vertical coordinate represents RelErrY, 651 represents errors obtained by using the motion correction method that is not based on an external motion signal according to an embodiment of the present disclosure, and 652 represents errors obtained by using the motion correction method that is based on an external motion signal according to an embodiment of the present disclosure. It can be seen that the method based on an external motion signal (PT) has better convergence.

The embodiments of the present disclosure have the following beneficial technical effects:

1) In the embodiments of the present disclosure, fewer unknown parameters are used, and a motion correction speed is higher.

An unknown parameter $a_i$ has a size of $(N_f*N_s)$ $N_f$ is a number of degrees of freedom of motion in a predefined displacement field, and $N_s$ is a number of instances of excitations. For example, for rigid body motion, $N_f=6$ or 9, and Ns is usually less than 256.

In this method, unknown $m_i$ has a size of $N_c*N_f$. $N_c$ is a number of channels of the external motion signal, that is, a number of receive coils, and $N_c$ is usually less than 256.

In an existing GRICS method, a motion displacement field is modeled as a linear combination of an external motion signal and a coefficient map, with one coefficient map for each input signal and each spatial dimension. Therefore, there are a number $N_c*N_e*3$ of elements in the coefficient map. $N_e$ is an image size, which is generally greater than 128*128 or even greater than 256*256*192.

This generates much more unknown variables than those in the embodiments of the present disclosure, especially for rigid body motion.

2) The unknown parameter in the embodiments of the present disclosure is time-dependent, and the motion correction speed is high.

The coefficient map in the existing GRICS method is time-independent, whereas in the embodiments of the present disclosure, $a_i$ and $m_i$ are time-dependent.

3) In the embodiments of the present disclosure, the predefined displacement fields are introduced, rigid or non-rigid body motion is modeled by using a linear combination of the predefined displacement fields, and the motion parameter is used as a displacement field combination coefficient (u=Da). The motion parameter may also be described as a linear combination of the external motion signal and an external motion signal combination coefficient (u=DPm), and the external motion signal may be any signal related to a motion state of the imaging target. Therefore, the embodiments of the present disclosure may be applied in rigid body and non-rigid body motion correction flexibly, and may be applied with or without an external motion signal.

It should be noted that, because the pilot tone signal has a very high time resolution and more channels, includes more motion information than a sensor, for example, ECG and a respiratory belt, and may represent more motion states, a better motion correction result can be obtained. In addition, a pilot tone signal is not related to a sequence, and therefore, in an exemplary embodiment, the external motion signal may be a pilot tone signal.

Figure 7:
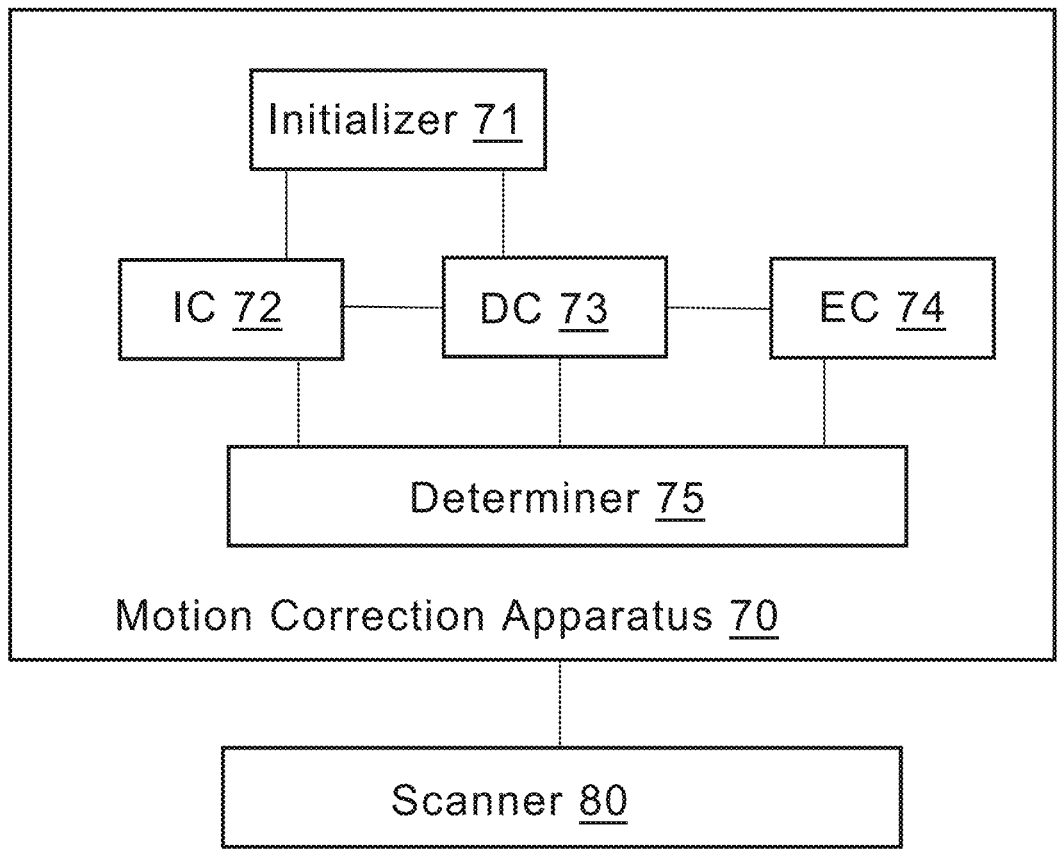
FIG. 7 is a schematic structural diagram of a magnetic resonance system, including a motion correction apparatus for an MR image and a scanner, according to an embodiment of the present disclosure.

FIG. 7 is a schematic structural diagram of a magnetic resonance imaging system including a motion correction apparatus 70 for a magnetic resonance image and a scanner 80, according to an embodiment of the present disclosure. The apparatus 70 may be referred to herein as controller 70. The apparatus 70 may include an initialization module (also referred to herein as an initializer or initialization circuitry) 71, an MR image correction module (also referred to herein as an image corrector or image correction circuitry) 72, a K-space data correction module (also referred to herein as an K-space data corrector or K-space data correction circuitry) 73, an error calculation module (also referred to herein as error calculator or error calculation circuitry) 74, and a determination module (also referred to herein as determiner or determination circuitry) 75. In one or more exemplary embodiments, the apparatus 70 (and/or one or more components comprised therein) may include processing circuitry that is configured to perform one or more operations and/or functions of the apparatus and/or respective component(s) therein.

The initialization module 71 is configured to initialize a current motion parameter of an imaging target.

The MR image correction module 72 is configured to calculate a current motion-corrected MR image based on the current motion parameter of the imaging target that is initialized by the initialization module 71 or sent by the determination module 75 and K-space measurement data of the imaging target.

The K-space data correction module 73 is configured to calculate current motion-corrected K-space data based on the current motion parameter of the imaging target that is initialized by the initialization module 71 or sent by the determination module 75 and the current motion-corrected MR image calculated by the MR image correction module 72.

The error calculation module 74 is configured to calculate a current K-space measurement data error based on the K-space measurement data of the imaging target and the current motion-corrected K-space data calculated by the K-space data correction module 73.

The determination module 75 is configured to: determine, based on the current K-space measurement data error calculated by the error calculation module 74, whether an iteration end condition is currently met, and if the iteration end condition is currently met, use the current motion-corrected MR image calculated by the MR image correction module 72 as a final motion-corrected MR image to be used, otherwise update the current motion parameter of the imaging target based on the current K-space measurement data error and the current motion-corrected MR image, and send the updated current motion parameter of the imaging target to the MR image correction module 72 and the K-space data correction module 73.

In an exemplary embodiment, initializing a current motion parameter of an imaging target by the initialization module 71 may include: initializing the current motion parameter of the imaging target as a zero vector.

In an exemplary embodiment, the current motion parameter of the imaging target is relative displacement of the imaging target during a current iteration process relative to a previous iteration process.

In an exemplary embodiment, the MR image correction module 72 is specifically configured to:

calculate $x_i$ according to $y=AFST(a_i)x_i$, where y is the K-space measurement data of the imaging target, A is a K-space sampling mode mask, F is a fast Fourier transform operator, S is receive coil sensitivity, $a_i$ is the current motion parameter of the imaging target, $T(a_i)$ is a conversion function for applying $a_i$ to an image $x_i$ to generate a motion-corrected image, $x_i$ is the current motion-corrected MR image, and i is an iteration sequence number.

In an exemplary embodiment, the K-space data correction module 73 is specifically configured to:

calculate $y_i$ according to $y_i=AFST(a_i)x_i$, where $y_i$ is the current motion-corrected K-space data, A is a K-space sampling mode mask, F is a fast Fourier transform operator, S is receive coil sensitivity, $a_i$ is the current motion parameter of the imaging target, $T(a_i)$ is a conversion function for applying $a_i$ to an image $x_i$ to generate a motion-corrected image, $x_i$ is the current motion-corrected MR image, and i is an iteration sequence number.

In an exemplary embodiment, updating the current motion parameter of the imaging target by the determination module 75 based on the current K-space measurement data error and the current motion-corrected MR image may include:

calculating the updated current motion parameter $a_{i+1}$ of the imaging target according to $r_i=AFSG(x_i)Da_i$, with $a_{i+1}=a_i+\Delta a_i$, where $r_i$ is the current K-space measurement data error, A is a K-space sampling mode mask, F is a fast Fourier transform operator, S is receive coil sensitivity, $x_i$ is the current motion-corrected MR image, $G(x_i)$ is a gradient of $x_i$, D is a preset motion displacement field, $a_i$ is the current motion parameter of the imaging target, $\Delta a_i$ is a current incremental motion parameter, and i is an iteration sequence number.

In an exemplary embodiment, the current motion parameter of the imaging target is a current coefficient vector of an external motion signal of the imaging target.

The MR image correction module 72 is specifically configured to calculate the current motion-corrected MR image based on an external motion signal of the imaging target during an MR imaging process, a current coefficient vector of the external motion signal, and the K-space measurement data of the imaging target.

The K-space data correction module 73 is specifically configured to calculate the current motion-corrected K-space data based on the external motion signal, the current coefficient vector of the external motion signal, and the current motion-corrected MR image.

Updating the current motion parameter of the imaging target by the determination module 75 based on the current K-space measurement data error and the current motion-corrected MR image may include: updating the current coefficient vector of the external motion signal based on the current K-space measurement data error, the current motion-corrected MR image, and the external motion signal.

In an exemplary embodiment, the MR image correction module 72 is specifically configured to:

calculate $x_i$ according to $y=AFST(Pm_i)x_i$, where y is the K-space measurement data of the imaging target, A is a K-space sampling mode mask, F is a fast Fourier transform operator, S is receive coil sensitivity, P is the external motion signal, $m_i$ is the current coefficient vector of the external motion signal, $T(Pm_i)$ is a conversion function for applying $Pm_i$ to an image $x_i$ to generate a motion-corrected image, $x_i$ is the current motion-corrected MR image, and i is an iteration sequence number.

In an exemplary embodiment, the K-space data correction module 73 is specifically configured to:

calculate $y_i$ according to $y_i=AFST(Pm_i)x_i$, where $y_i$ is the current motion-corrected K-space data, A is a K-space sampling mode mask, F is a fast Fourier transform operator, S is receive coil sensitivity, P is the external motion signal, $m_i$ is the current coefficient vector of the external motion signal, $T(Pm_i)$ is a conversion function for applying $Pm_i$ to an image $x_i$ to generate a motion-corrected image, $x_i$ is the current motion-corrected MR image, and i is an iteration sequence number.

In an exemplary embodiment, updating the current coefficient vector of the external motion signal by the determination module 75 based on the current K-space measurement data error, the current motion-corrected MR image, and the external motion signal may include: calculating the updated current coefficient vector $m_{i+1}$ of the external motion signal according to:

$r_i=AFSG(x_i)DP\Delta m_i$, with $m_{i+1}=m_i+\Delta m_i$, where $r_i$ is the current K-space measurement data error, A is a K-space sampling mode mask, F is a fast Fourier transform operator, S is receive coil sensitivity, $x_i$ is the current motion-corrected MR image, $G(x_i)$ is a gradient of $x_i$, D is a preset motion displacement field, P is the external motion signal, $m_i$ is the current coefficient vector of the external motion signal, $\Delta m_i$ is a current incremental coefficient vector of the external motion signal, and i is an iteration sequence number.

In an exemplary embodiment, the error calculation module 74 is specifically configured to use a difference between the K-space measurement data of the imaging target and the current motion-corrected K-space data as the current K-space measurement data error.

Determining, by the determination module 75, whether an iteration end condition is currently met may include: determining whether the current K-space measurement data error falls within a preset first range, and if the current K-space measurement data error falls within the preset first range, determining that the iteration end condition is currently met; or determining whether a difference between the current K-space measurement data error and a K-space measurement data error occurring during a previous iteration process falls within a preset second range, and if the difference falls within the preset second range, determining that the iteration end condition is currently met.

In an exemplary embodiment, when the imaging target may include a plurality of parts whose motion models are independent of each other, the initialization module 71 is specifically configured to separately set a respective current motion parameter for each part, and separately initialize the current motion parameter of each part, where the current motion parameters of all the parts constitute the current motion parameter of the imaging target.

In an exemplary embodiment, when the final motion-corrected MR image to be used has a lower resolution than a required resolution, after using the current motion-corrected MR image as the final motion-corrected MR image to be used, the determination module 75 is further configured to: separately multiply, based on a ratio between the required resolution and the resolution of the final motion-corrected MR image to be used, each translation parameter or each translation parameter and each shear parameter in the current motion parameter by the ratio, to obtain the updated current motion parameter; and when K-space measurement data of the imaging target that corresponds to the required resolution is collected, calculate the current motion-corrected MR image based on the updated current motion parameter and the collected K-space measurement data.

A magnetic resonance imaging system provided in an embodiment of the present disclosure may include a motion correction apparatus 70 for a magnetic resonance image according to the above embodiment. In an exemplary embodiment, the system may further include a scanner 80 (see FIG. 7). The scanner 80 may include a magnet unit and a patient receiving region surrounded by the scanner 80 for receiving a patient. The main magnet may generate a strong and constant main magnetic field. Furthermore, the scanner 80, in particular the magnet unit, may have a gradient coil unit for generating magnetic field gradients that are used for position encoding during an imaging process.

The above descriptions are merely exemplary embodiments of the present disclosure, but not intended to limit the present disclosure. Any modifications, equivalent substitutions, improvements, etc. made within the spirit and principle of the present disclosure should be included within the scope of protection of the present disclosure.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

The various components described herein may be referred to as "modules," "units," or "devices." Such components may be implemented via any suitable combination of hardware and/or software components as applicable and/or known to achieve their intended respective functionality. This may include mechanical and/or electrical components, processors, processing circuitry, or other suitable hardware components, in addition to or instead of those discussed herein. Such components may be configured to operate independently, or configured to execute instructions or computer programs that are stored on a suitable computer-readable medium. Regardless of the particular implementation, such modules, units, or devices, as applicable and relevant, may alternatively be referred to herein as "circuitry," "controllers," "processors," or "processing circuitry," or alternatively as noted herein.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

REFERENCE LIST

101-105 Step
21 Horizontal translation
22 Perpendicular translation
23 Rotation
31 Head area (without eyes)
32 Eye area
33 Neck area
41 MR image collected when an imaging target is not moving during an imaging process
42 Motion-damaged MR image collected when an imaging target is moving during an imaging process
43 MR image obtained after performing motion correction on 42 by using a motion correction method that is based on an external motion signal according to an embodiment of the present disclosure
44 Error image obtained by comparing 43 with 41
45 Comparison diagram of errors respectively obtained after performing motion correction on 42 by using a motion correction method that is not based on an external motion signal according to an embodiment of the present disclosure, a motion correction method that is based on an external motion signal according to an embodiment of the present disclosure, and an existing method
46 Schematic diagram of an error obtained by comparing 43 with 41
51 Spikes caused by an external motion signal such as a radio frequency pulse and a signal change
52 Schematic diagram of an average PT signal obtained by averaging PT signals collected in each instance of excitation
61 MR image collected when an imaging target is not moving during an imaging process
62 Motion-damaged MR image collected when an imaging target is moving during an imaging process 63 MR image obtained after performing motion correction on 62 by using a method that is based on an external motion signal according to an embodiment of the present disclosure 64 MR image obtained after performing motion correction on 62 by using a method that is not based on an external motion signal and according to an embodiment of the present disclosure 65 Comparison diagram of errors respectively obtained after performing motion correction by using a motion correction method that is not based on an external motion signal according to an embodiment of the present disclosure and a motion correction method that is based on an external motion signal according to an embodiment of the present disclosure 651 Curve of errors obtained by performing motion correction by using a motion correction method that is not based on an external motion signal according to an embodiment of the present disclosure 652 Curve of errors obtained by performing motion correction by using a motion correction method that is based on an external motion signal according to an embodiment of the present disclosure 70 Motion correction apparatus for MR image
71 Initialization module
72 MR image correction module
73 K-space data correction module
74 Error calculation module
75 Determination module

The invention claimed is:

1. A motion correction method for a magnetic resonance (MR) image, comprising:
    initializing a current motion parameter of an imaging target;
    calculating a current motion-corrected MR image based on the current motion parameter of the imaging target and K-space measurement data of the imaging target;
    calculating current motion-corrected K-space data based on the current motion parameter of the imaging target and the current motion-corrected MR image;
    calculating a current K-space measurement data error based on the K-space measurement data of the imaging target and the current motion-corrected K-space data; and
    determining, based on the current K-space measurement data error, whether an iteration end condition is currently met, wherein:
    in response to the iteration end condition being currently met, selecting the current motion-corrected MR image as a final motion-corrected MR image to be used, and
    in response to the iteration end condition not currently being met, updating the current motion parameter of the imaging target based on the current K-space measurement data error and the current motion-corrected MR image, and again performing the calculating the current motion-corrected MR image based on the current motion parameter of the imaging target and K-space measurement data of the imaging target.

2. The method according to claim 1, wherein the initializing a current motion parameter of an imaging target comprises: initializing the current motion parameter of the imaging target as a zero vector.

3. The method according to claim 1, wherein the current motion parameter of the imaging target is relative displacement of the imaging target during a current iteration process relative to a previous iteration process.

4. The method according to claim 3, wherein the calculating a current motion-corrected MR image based on the current motion parameter of the imaging target and K-space measurement data of the imaging target comprises:
    calculating $x_i$ according to $y=AFST(a_i)x_i$,
    wherein y is the K-space measurement data of the imaging target, A is a K-space sampling mode mask, F is a fast Fourier transform operator, S is receive coil sensitivity, $a_i$ is the current motion parameter of the imaging target, $T(a_i)$ is a conversion function for applying $a_i$ to an image $x_i$ to generate a motion-corrected image, $x_i$ is the current motion-corrected MR image, and i is an iteration sequence number.

5. The method according to claim 3, wherein the calculating current motion-corrected K-space data based on the current motion parameter of the imaging target and the current motion-corrected MR image comprises:
    calculating $y_i$ according to $y_i=AFST(a_i)x_i$,
    wherein $y_i$ is the current motion-corrected K-space data, A is a K-space sampling mode mask, F is a fast Fourier transform operator, S is receive coil sensitivity, $a_i$ is the current motion parameter of the imaging target, $T(a_i)$ is a conversion function for applying $a_i$ to an image $x_i$ to generate a motion-corrected image, $x_i$ is the current motion-corrected MR image, and i is an iteration sequence number.

6. The method according to claim 3, wherein the updating the current motion parameter of the imaging target based on the current K-space measurement data error and the current motion-corrected MR image comprises:
    calculating the updated current motion parameter $a_{i+1}$ of the imaging target according to $r_i=AFSG(x_i)D\Delta a_i$, with $a_{i+1}=a_i+\Delta a_i$,
    wherein $r_i$ is the current K-space measurement data error, A is a K-space sampling mode mask, F is a fast Fourier transform operator, S is receive coil sensitivity, $x_i$ is the current motion-corrected MR image, $G(x_i)$ is a gradient of $x_i$, D is a preset motion displacement field, $a_i$ is the current motion parameter of the imaging target, $\Delta a_i$ is a current incremental motion parameter, and i is an iteration sequence number.

7. The method according to claim 1, wherein:
    the current motion parameter of the imaging target is a current coefficient vector of an external motion signal of the imaging target;
    the calculating a current motion-corrected MR image based on the current motion parameter of the imaging target and K-space measurement data of the imaging target comprises: calculating the current motion-corrected MR image based on an external motion signal of the imaging target during an MR imaging process, a current coefficient vector of the external motion signal, and the K-space measurement data of the imaging target;
    the calculating current motion-corrected K-space data based on the current motion parameter of the imaging target and the current motion-corrected MR image comprises: calculating the current motion-corrected K-space data based on the external motion signal, the current coefficient vector of the external motion signal, and the current motion-corrected MR image; and
    the updating the current motion parameter of the imaging target based on the current K-space measurement data error and the current motion-corrected MR image comprises: updating the current coefficient vector of the external motion signal based on the current K-space measurement data error, the current motion-corrected MR image, and the external motion signal.

8. The method according to claim 7, wherein the calculating the current motion-corrected MR image based on an external motion signal of the imaging target during an MR imaging process, a current coefficient vector of the external motion signal, and the K-space measurement data of the imaging target comprises:

calculating $x_i$ according to $y=AFST(Pm_i)x_i$, wherein y is the K-space measurement data of the imaging target, A is a K-space sampling mode mask, F is a fast Fourier transform operator, S is receive coil sensitivity, P is the external motion signal, $m_i$ is the current coefficient vector of the external motion signal, $T(Pm_i)$ is a conversion function for applying $Pm_i$ to an image $x_i$ to generate a motion-corrected image, $x_i$ is the current motion-corrected MR image, and i is an iteration sequence number.

9. The method according to claim 7, wherein the calculating the current motion-corrected K-space data based on the external motion signal, the current coefficient vector of the external motion signal, and the current motion-corrected MR image comprises:

calculating $y_i$ according to $y_i=AFST(Pm_i)x_i$, wherein $y_i$ is the current motion-corrected K-space data, A is a K-space sampling mode mask, F is a fast Fourier transform operator, S is receive coil sensitivity, P is the external motion signal, $m_i$ is the current coefficient vector of the external motion signal, $T(Pm_i)$ is a conversion function for applying $Pm_i$ to an image $x_i$ to generate a motion-corrected image, $x_i$ is the current motion-corrected MR image, and i is an iteration sequence number.

10. The method according to claim 7, wherein the updating the current coefficient vector of the external motion signal based on the current K-space measurement data error, the current motion-corrected MR image, and the external motion signal comprises:

calculating the updated current coefficient vector $m_{i+1}$ of the external motion signal according to $r_i=AFSG(x_i)DP\Delta m_i$, with $m_{i+1}=m_i+\Delta m_i$, wherein $r_i$ is the current K-space measurement data error, A is a K-space sampling mode mask, F is a fast Fourier transform operator, S is receive coil sensitivity, $x_i$ is the current motion-corrected MR image, $G(x_i)$ is a gradient of $x_i$, D is a preset motion displacement field, P is the external motion signal, $m_i$ is the current coefficient vector of the external motion signal, $\Delta m_i$ is a current incremental coefficient vector of the external motion signal, and i is an iteration sequence number.

11. The method according to claim 1, wherein:
the calculating a current K-space measurement data error based on the K-space measurement data of the imaging target and the current motion-corrected K-space data comprises: using a difference between the K-space measurement data of the imaging target and the current motion-corrected K-space data as the current K-space measurement data error; and
the determining, based on the current K-space measurement data error, whether an iteration end condition is currently met comprises:
determining whether the current K-space measurement data error falls within a preset first range, and if the current K-space measurement data error falls within the preset first range, determining that the iteration end condition is currently met; or
determining whether a difference between the current K-space measurement data error and a K-space measurement data error occurring during a previous iteration process falls within a preset second range, and if the difference falls within the preset second range, determining that the iteration end condition is currently met.

12. The method according to claim 1, wherein, when the imaging target comprises a plurality of parts whose motion models are independent of each other, the initializing a current motion parameter of an imaging target comprises:
separately setting a respective current motion parameter for each part, and separately initializing the current motion parameter of each part, wherein the current motion parameters of all the parts constitute the current motion parameter of the imaging target.

13. The method according to claim 1, wherein, when the final motion-corrected MR image to be used has a lower resolution than a required resolution, after the using the current motion-corrected MR image as a final motion-corrected MR image to be used, the method further comprises:
separately multiplying, based on a ratio between the required resolution and the resolution of the final motion-corrected MR image to be used, each translation parameter or each translation parameter and each shear parameter in the current motion parameter by the ratio, to obtain the updated current motion parameter; and
in response to K-space measurement data of the imaging target that corresponds to the required resolution is collected, calculating the current motion-corrected MR image based on the updated current motion parameter and the collected K-space measurement data.

14. A non-transitory computer-readable storage medium with an executable program stored thereon, that when executed, instructs a processor to perform the method of claim 1.

15. A motion correction apparatus for a magnetic resonance (MR) image, comprising:
an initializer configured to initialize a current motion parameter of an imaging target;
an MR image corrector configured to calculate a current motion-corrected magnetic resonance (MR) image based on the current motion parameter of the imaging target and K-space measurement data of the imaging target;
a K-space data corrector configured to calculate current motion-corrected K-space data based on the current motion parameter of the imaging target and the current motion-corrected MR image;
an error calculator configured to calculate a current K-space measurement data error based on the K-space measurement data of the imaging target and the current motion-corrected K-space data; and
a determiner configured to: determine, based on the current K-space measurement data error, whether an iteration end condition is currently met, wherein:
in response to the iteration end condition being currently met, selecting the current motion-corrected MR image as a final motion-corrected MR image to be used, and
in response to the iteration end condition not currently being met, updating the current motion parameter of the imaging target based on the current K-space measurement data error and the current motion-corrected MR image, and sending the updated current motion parameter of the imaging target to the MR image corrector and the K-space data corrector.

16. A magnetic resonance imaging system, comprising a motion correction apparatus according to claim 15.

17. The magnetic resonance imaging system according to claim 16, further comprising a scanner.

18. A motion correction apparatus for a magnetic resonance (MR) image, comprising:
   one or more processors; and
   memory storing instructions that, when executed by the one or more processors, configure the apparatus to:
     initialize a current motion parameter of an imaging target;
     calculate a current motion-corrected magnetic resonance (MR) image based on the current motion parameter of the imaging target and K-space measurement data of the imaging target;
     calculate current motion-corrected K-space data based on the current motion parameter of the imaging target and the current motion-corrected MR image;
     calculate a current K-space measurement data error based on the K-space measurement data of the imaging target and the current motion-corrected K-space data; and
     determine, based on the current K-space measurement data error, whether an iteration end condition is currently met, wherein:
       in response to the iteration end condition being currently met, selecting the current motion-corrected MR image as a final motion-corrected MR image to be used, and
       in response to the iteration end condition not currently being met, updating the current motion parameter of the imaging target based on the current K-space measurement data error and the current motion-corrected MR image.

19. A magnetic resonance imaging system, comprising a motion correction apparatus according to claim 18.

* * * * *